United States Patent
Serra et al.

(10) Patent No.: US 8,762,081 B2
(45) Date of Patent: Jun. 24, 2014

(54) DEVICE AND METHOD FOR LOCATING PARTIAL DISCHARGES

(75) Inventors: Stefano Serra, San Vittore di Olona (IT); Andrea Cavallini, San Pietro in Casale (IT); Gian Carlo Montanari, Zola Predosa (IT); Gaetano Pasini, Marano sul Panaro (IT)

(73) Assignee: Techimp Technologies S.R.L., Bologna (IT)

( * ) Notice: Subject to any disclaimer, the term of this patent is extended or adjusted under 35 U.S.C. 154(b) by 0 days.

(21) Appl. No.: 13/258,335

(22) PCT Filed: Mar. 18, 2010

(86) PCT No.: PCT/IB2010/051176
§ 371 (c)(1),
(2), (4) Date: Sep. 21, 2011

(87) PCT Pub. No.: WO2010/109382
PCT Pub. Date: Sep. 30, 2010

(65) Prior Publication Data
US 2012/0022809 A1    Jan. 26, 2012

(30) Foreign Application Priority Data
Mar. 27, 2009  (IT) .............................. BO2009A0192

(51) Int. Cl.
*G01R 31/00* (2006.01)
*G01R 31/08* (2006.01)
*G01R 31/28* (2006.01)

(52) U.S. Cl.
CPC ...................................... *G01R 31/08* (2013.01)
USPC .............................. 702/59; 324/512; 324/528

(58) Field of Classification Search
USPC ..................................... 702/59; 324/512, 528
See application file for complete search history.

(56) References Cited

U.S. PATENT DOCUMENTS

| 5,070,537 A | 12/1991 | Ohira et al. |
| 5,508,619 A | 4/1996 | Ozawa et al. |
| 5,682,100 A | 10/1997 | Rossi et al. |

(Continued)

FOREIGN PATENT DOCUMENTS

| EP | 0 649 029 A2 | 4/1995 |
| EP | 1 016 869 A2 | 7/2000 |

(Continued)

*Primary Examiner* — John Breene
*Assistant Examiner* — Manuel Rivera Vargas
(74) *Attorney, Agent, or Firm* — Pearne & Gordon LLP

(57) ABSTRACT

A method for locating partial discharges occurring at a discharge site (2) in an electric apparatus (3) with elongate geometry and generating corresponding electric pulses (4) propagating in opposite directions along the apparatus (3) from the discharge site (2) comprises the steps of detecting (11) the electric pulses (4) picked up by a first and a second sensor (5, 7), operatively connected to the apparatus (3) and spaced out along it, and generating corresponding electric signals representative of the waveform of the pulses (4), selecting (12) at least one pair of signals, detected in the consecutive sensors (5, 7), and representative of a pair of homologous pulses (4), relating to the same partial discharge and propagating in opposite directions along the apparatus, deriving, for the signals of the selected pair of homologous pulses (4), at least one attenuation parameter, correlated with a quantity that is variable depending on the distance travelled by the pulses (4), calculating (13) the distance between the discharge site (2) and the sensors, based on processing the values of the attenuation parameter for the signals of the selected pair of homologous pulses (4).

10 Claims, 2 Drawing Sheets

(56) References Cited

U.S. PATENT DOCUMENTS

| | | |
|---|---|---|
| 5,719,503 A | 2/1998 | Burnett |
| 5,729,144 A | 3/1998 | Cummins |
| 6,366,095 B1 | 4/2002 | Van Aartrijk |
| 6,597,180 B1 | 7/2003 | Takaoka et al. |
| 6,741,916 B1 | 5/2004 | Sekiguchi et al. |
| 2004/0189317 A1 | 9/2004 | Borchert et al. |
| 2009/0177420 A1* | 7/2009 | Fournier et al. ............ 702/59 |

FOREIGN PATENT DOCUMENTS

| | | |
|---|---|---|
| EP | 1 099 951 A2 | 5/2001 |
| JP | 61 215970 A | 9/1986 |
| WO | 97/11380 A1 | 3/1997 |

\* cited by examiner

DEVICE AND METHOD FOR LOCATING PARTIAL DISCHARGES

TECHNICAL FIELD

This invention relates to a device and a method for locating partial discharges occurring at a discharge site in an electric apparatus with elongate geometry and generating corresponding electric pulses propagating in opposite directions along the apparatus from the discharge site.

More generally, this invention relates to the technical field of diagnosing electrical systems (particularly high-voltage systems) by detecting/processing partial electrical discharges.

BACKGROUND ART

It should be noted that a partial discharge is an electric discharge limited to a portion of the insulation of an electrical system and does not therefore cause immediate failure of the system but its gradual degradation. By their very nature, therefore, partial discharges are substantially limited in extent to a defect in the insulating system.

In light of this, diagnostic methods based on the detection and interpretation of partial discharges are among the most promising and widely studied in the context of scientific research since processing the signals relating to partial discharges makes it possible to investigate the nature of defects in the insulating system where the discharges occur and locate the position of the defects in the insulating system.

More specifically, this invention relates to the diagnostics of electrical apparatuses with elongate geometry constituting a line for the transmission of the discharge pulses, that is to say, forming a path along which the pulses propagate; for example, apparatuses of this kind include electrical cables for medium and high voltages, autotransformers or GILs (gas insulated lines).

In this type of apparatus, it is important to identify any defects that might lead to cable failure, such as, for example, defects in the joints or terminations or even in the cable insulation. These defects are usually the site of partial discharges; generally speaking, therefore, the object is to identify the defects by detecting the corresponding partial discharges using suitable sensors coupled to the cable being checked.

Several methods are known for locating a discharge site along a cable.

One of these, known as reflectometric method, involves acquiring the signals at a detecting station located at one end of the cable and measuring the time interval that elapses between one signal and the signal reflected back by that signal from the opposite end of the cable. The distance of the source of that signal from the detection point is then calculated on the basis of the speed at which the signals propagate in that cable.

This method is not very reliable for long cables since the signals travelling the cable are attenuated to such an extent that there is the risk of not being able to detect them at all at the detecting station.

Another method involves coupling to the cable a plurality of sensors (at least 2, and usually 3) at different positions along the cable (thereby forming a plurality of detecting stations). When the signal at one of the sensors exceeds a predetermined level, the signals from the different sensors are acquired synchronously; the acquisition time window must be long enough to allow measurement of the same pulse in transit through the different sensors. Comparing the times at which the same signal reaches each of the sensors makes it possible to locate the source of the signals along the cable.

This method is more accurate than the reflectometric method but poses some problems.

A first problem is that of identifying a pair of homologous pulses, that is to say, pulses assignable to the same partial discharge and propagating in opposite directions.

It should be noted that the presence of a pair of homologous pulses detected at two different sensors spaced from each other along the apparatus means that the site where the discharge that generated these pulses took place is located between the two sensors.

In light of this, the prior art solutions (for example, U.S. Pat. No. 5,070,537 or U.S. Pat. No. 6,366,095) teach synchronizing the signals detected at the different sensors through an absolute time reference, for example a GPS.

These prior art devices comprise:
  a first and a second sensor connected to the apparatus in a first and a second detecting station and spaced out along the apparatus, for detecting electric signals;
  a processing unit connected to the sensors for receiving the signals and having a module for selecting at least one pair of signals, detected in the first and second sensors and representative of a pair of homologous pulses (that is to say, pulses relating to the same partial discharge and propagating in opposite directions along the apparatus), and a module for calculating the distance between the discharge site and the detecting stations based on the selected pair of homologous pulses.

In the prior art solutions, the calculation module processes the following information: an estimate of the speed of pulse propagation in the cable, the distance between the detecting stations and the time that elapses between the instants the pulses of the pair considered are detected.

From the time that elapses between the instants the pulses of the pair considered are detected is derived the quantity by which the discharge site is displaced along the cable in the direction of one of the detecting stations relative to the other. In light of this, if the signals of the pair are detected simultaneously, it means the discharge site is equidistant from the detecting stations.

Based on this information and on the distance between the detecting stations, the calculation module finds the distance of the discharge site from the detecting stations.

These systems have two drawbacks, however.

A first drawback is due to the difficulty of reliably identifying the partial discharges to be examined. That is to say, the fact that two signals are detected by respective sensors in a sufficiently short interval of time (compatibly with the estimated speed of pulse propagation in the apparatus and the distance between the sensors) does not guarantee that those signals are from partial discharges, and in particular from the same partial discharge.

In fact, numerous signals may be coupled to the sensors other than the target signals corresponding to the partial discharges to be identified; these unwanted signals may consist of background noise or disturbances of another nature, or even other partial discharges (occurring at another discharge site or outside the cable).

All these signals substantially accompany the target signals generated by the partial discharges to be detected and often prevent the latter from being identified (especially if their amplitude is greater than that of the target signals to be detected).

To overcome this drawback, the prior art methods teach the use of suitable adjusted filtering sensors and systems in an attempt to detect the partial discharge signals without detecting the noise signals.

These systems do not, however, make it possible to determine whether the signals detected are due to the same partial discharge activity.

Moreover, these methods have inherent shortcomings.

Indeed, it is impossible to provide sensors optimized for each and every circumstance and the filtering systems are often ineffective. Also, since the frequency of the target discharge signals to be detected is not known beforehand, there is the risk of filtering out those very signals.

Lastly, when the signals generated by target partial discharge activities to be detected are accompanied by other signals generated by partial discharges to be ignored (for example because they are outside the cable), there is the risk that these signals cannot be selectively processed with filtering systems currently in use (consisting, for example, of analog passband filters).

A second shortcoming of known locating systems relates to the accuracy with which the target is located from the selected pair of homologous pulses.

The above mentioned prior art solutions involve processing the time phase shift between the signals in the pair of homologous pulses. This time phase shift allows calculation of the distance of the sensors from the discharge site, based on an estimation of the pulse propagation speed when the distance between the sensors is known.

This time domain comparison of the signals implies identifying corresponding reference points in the two signals (since the two pulses are not ideal but have each its own far from negligible development in time).

Typically, the first peak (or the highest peak) of the pulse is used as the reference for processing the time phase shift of the pulses.

This may lead to serious processing errors since the pulses, during their propagation in the apparatus, are deformed in proportion to the space travelled.

Also, there is a limit to the precision with which a time phase shift can be sensed by the instruments (even on the absurd assumption that the reference points for the pulses to be compared match perfectly). For example, a time precision of 100 ns, assuming that the pulses propagate at the speed of light, translates to a precision of 30 m.

Thus, the difficulties and shortcomings of the prior art as regards the accuracy of locating the signals detected are added to those regarding the identification of the signals actually associated with the discharge activities and in particular with the same partial discharge.

In light of this, the prior art methods do not guarantee reliable results and are often ineffective.

DISCLOSURE OF THE INVENTION

This invention has for an aim to provide a device and a method that overcome the above mentioned disadvantages of the prior art.

More specifically, the aim of this invention is to provide a device and a method for locating in a particularly accurate and precise manner partial discharges occurring at a discharge site in an electric apparatus with elongate geometry and generating corresponding electric pulses propagating in opposite directions axially along the apparatus from the discharge site.

The expression "axially" is used generically to mean that the electric pulses propagate along the apparatus, which has elongate geometry.

Thus, the expression "axially" must not be understood as referring only (and to some extent restrictively) to the specific case of apparatus with cylindrical geometry (such as a cable, for example).

Another aim of the invention is to provide a device and a method for locating partial discharges that are particularly reliable and robust in identifying a pair of homologous pulses used for locating.

These aims are fully achieved by the device according to the invention, as characterized in the appended claims and, more specifically, in that the processing unit comprises a module for deriving, for the signals of the selected pair of homologous pulses, at least one attenuation parameter, correlated with a quantity which is variable depending on a distance travelled by the pulses from the discharge site to the corresponding detecting station, the calculating module being configured to process the attenuation parameter values for the signals of the selected pair of homologous pulses.

The method according to the invention is characterized in that it comprises the following steps:
  detecting the electric pulses picked up by a first and a second sensor, operatively connected to the apparatus in a first and a second detecting station which are spaced out along the apparatus, and generating corresponding electric signals representative of the waveform of the pulses;
  selecting at least one pair of signals, detected in the first and the second sensor, representative of a pair of homologous pulses, relating to the same partial discharge and propagating in opposite directions along the apparatus;
  deriving, for the signals of the selected pair of homologous pulses, at least one attenuation parameter, correlated with a quantity that is variable depending on a distance travelled by the pulses from the discharge site to the corresponding detecting station;
  calculating the distance between the discharge site and the detecting stations, based on processing of the values of the attenuation parameter for the signals of the selected pair of homologous pulses.

BRIEF DESCRIPTION OF THE DRAWINGS

These and other features of the invention will become more apparent from the following description of a preferred, non-limiting embodiment of it, with reference to the accompanying drawings, in which.

DETAILED DESCRIPTION OF THE PREFERRED EMBODIMENTS OF THE INVENTION

Figure 1:
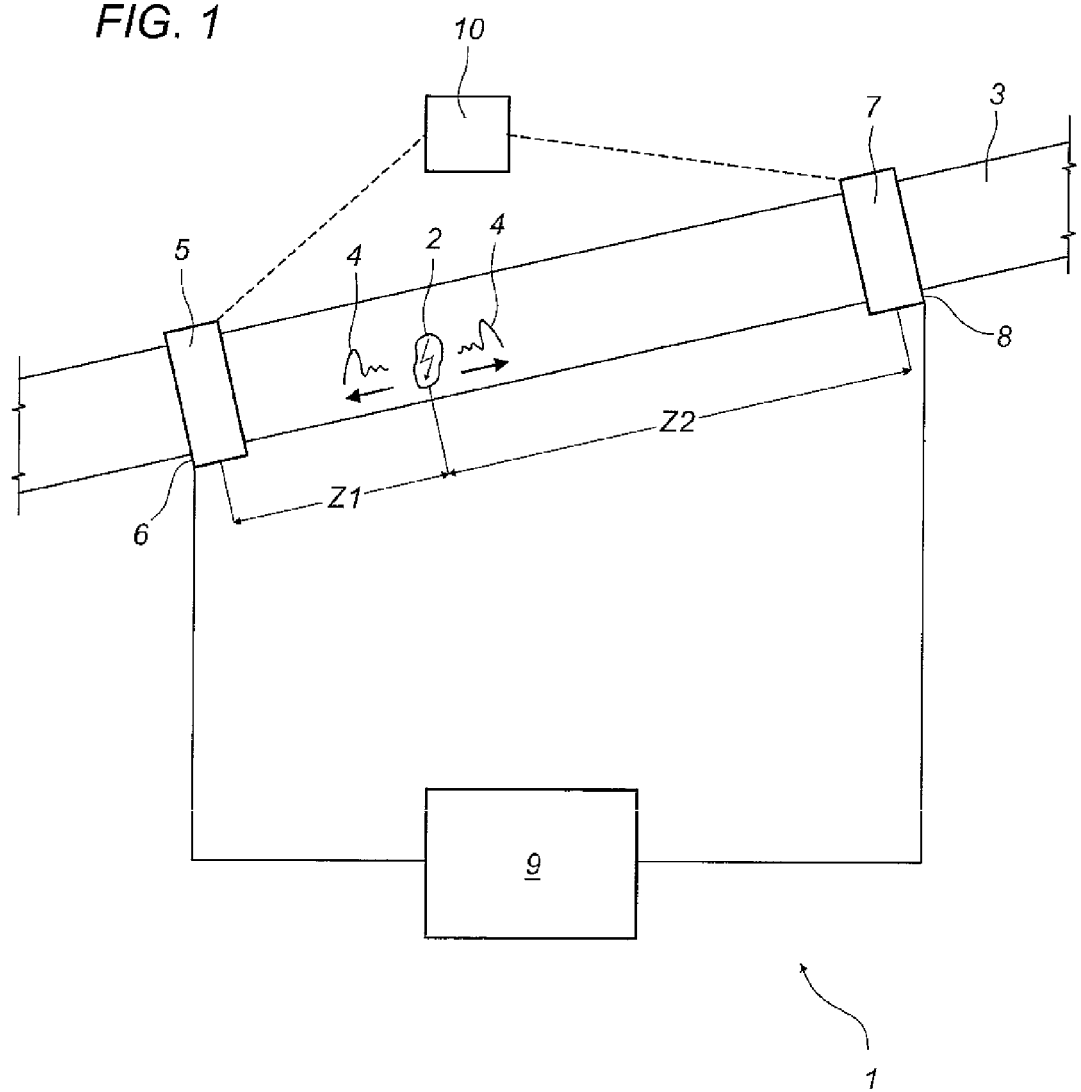
FIG. 1 schematically illustrates the device according to this invention.
Figure 2:
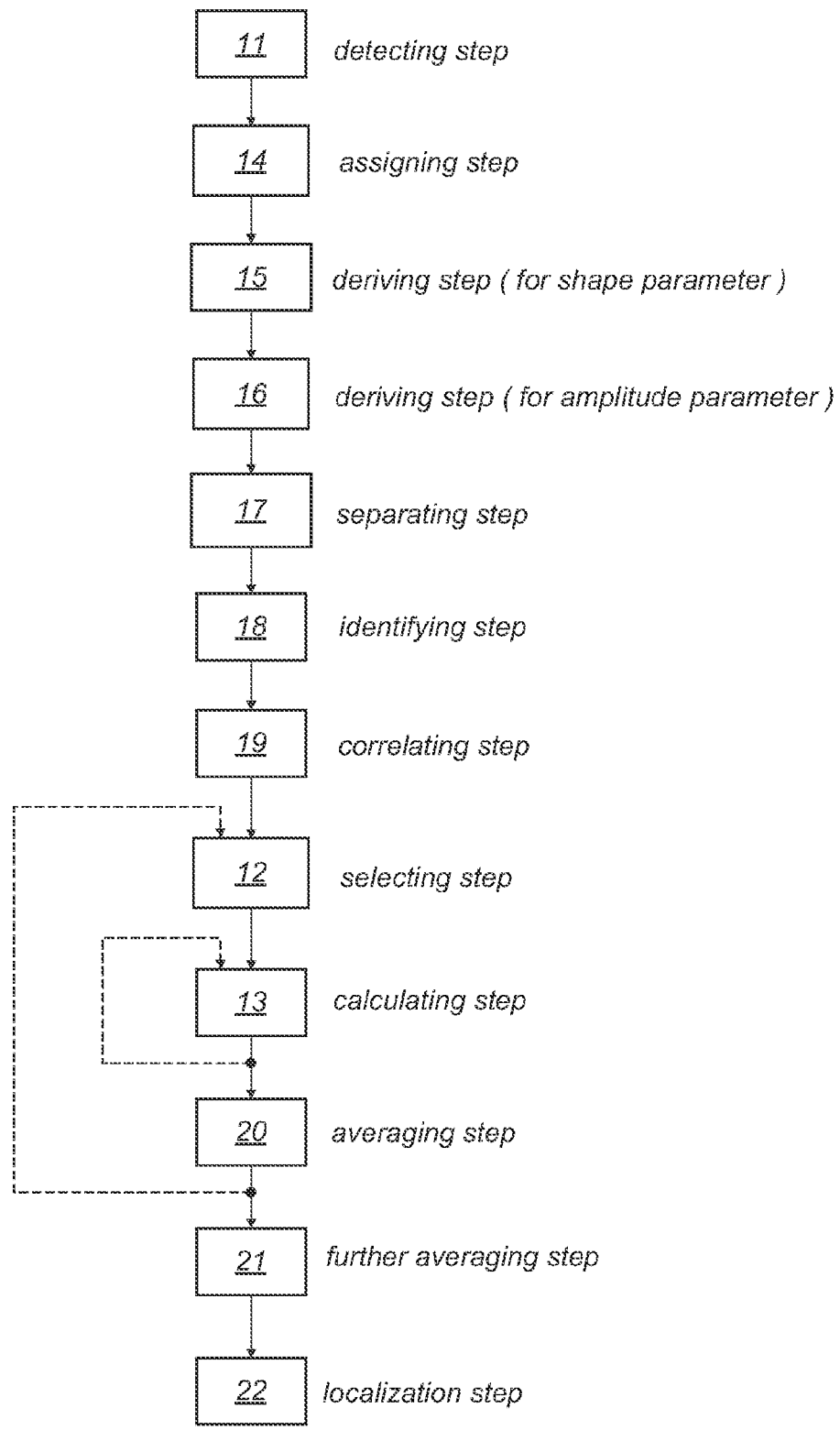
FIG. 2 schematically illustrates the method according to this invention.

The numeral 1 in FIG. 1 denotes a device according to this invention.

The device 1 is a device used for locating partial discharges occurring at a discharge site 2 in an electric apparatus 3 with elongate geometry and generating corresponding electric pulses 4 propagating in opposite directions axially along the apparatus 3 from the discharge site 2.

The device 1 for locating partial discharge sites is applicable, for example, on medium and high voltage cables, autotransformers or GILs.

The device 1 comprises a first sensor 5 which can connect to the apparatus 3 (for example to the cable) at a first detecting station 6.

The device 1 also comprises a second sensor 7 which can connect to the apparatus 3 at a second detecting station 8.

The sensors 5 and 7 are configured to detect analog electric signals representative of the waveform of the discharge pulses 4.

The sensors 5, 7 consist, for example, of magnetic probes, inductive or capacitive probes, or other known instruments.

Whatever the case, the sensors 5, 7, as regards the detection band, preferably cover a frequency range from approximately 1 MHz to approximately 6 GHz.

It should be noted, however, that the detection band defined by the sensors 5, 7 and by the processing unit 9 depends on the type and characteristics of the apparatus 3.

More specifically, in the case where the apparatus 3 is a cable, the sensors 5, 7, as regards the detection band, preferably define a cutoff frequency lower than approximately 2 MHz (or less) and a cutoff frequency greater than approximately 200 MHz (or more).

In the case where the apparatus 3 is a GIL, the sensors 5, 7, as regards the detection band, preferably define a cutoff frequency lower than approximately 300 MHz (or less) and a cutoff frequency greater than approximately 5 GHz (or more).

Preferably, the sensors 5 and 7 are of the directional type, that is to say, they are configured to detect the propagation direction of the pulses 4 along the apparatus 3.

The sensors 5, 7 are connected to a processing unit 9.

The processing unit 9 is configured to receive the signals detected by the sensors 5, 7 and to digitize them.

In effect, the sensors 5, 7 preferably detect analog electric signals representative of the waveform of the pulses 4; the processing unit 9 is designed to receive said analog signals and to generate corresponding digital signals representative of the waveform of the discharge pulses 4.

The first detecting station 6 and the second detecting station 8 are spaced out along the apparatus 3.

According to the invention, the device also comprises more than two sensors located along the apparatus 3 in corresponding detecting stations.

Each pair of consecutive sensors 5, 7 is designed to detect partial discharge pulses occurring in discharge sites 2 (that is, defects where partial discharges are generated and which in turn generate discharge pulses that propagate along the apparatus 3 in opposite directions) located in the stretch of the apparatus 3 extending between the sensors themselves.

The reference characters $z_1$ and $z_2$ in FIG. 1 denote the distances of the discharge site 2 from the sensors 5 and 7, respectively (that is, from the detecting stations 6 and 8, respectively).

In light of this, the presence of a large number of sensors reduces the distance between the discharge sites 2, if any, and the detecting stations for locating them (that is, it allows the average values of $z_1$ and $z_2$ to be reduced).

The processing unit 9 comprises a module for selecting at least one pair of signals detected in the first sensor 5 and in the second sensor 7 and representative of a pair of homologous pulses.

The term pair of homologous pulses means a pair of pulses 4 relating to (that is, generated by) the same partial discharge and propagating in opposite directions along the apparatus 3.

In light of this, it is advantageous that the sensors 5, 7 are of directional type.

The processing unit 9 also comprises a module for calculating the distance of the discharge site 2 from the detecting stations 6, 8 based on the selected pair of homologous pulses (that is, a module for calculating the values $z_1$ and $z_2$).

According to the invention, the processing unit 9 also comprises a derivation module, a separation module, an identification module and a correlation module.

The derivation module is configured to derive from the signals detected, in particular from the digital signals (representative of the waveform of the pulses 4):
- at least one shape parameter correlated with the waveform of the signal (that is, the waveform of the corresponding pulse 4);
- an amplitude parameter, correlated with the amplitude of the pulse 4 (for example, the peak value of the signal or the effective value of the signal correlated with the energy content of the pulse 4);
- a phase parameter representative of the phase of the voltage applied to the electrical apparatus 3 at the moment the signal is detected (assuming that the apparatus 3 is subjected to alternating voltage);

The separation module is configured to separate the sets of signals detected in each of the detecting stations into respective subsets, so that the digital signals of each subset have similar shape parameter values.

The identification module is configured to identify the separated subsets of signals relating to partial discharges. More specifically, the identification module is configured to statistically process the amplitude and phase parameter values for the signals of each subset processed individually, in order to classify it.

The correlation module is configured to correlate the subsets of signals detected in the first detecting station 6 and in the second detecting station 8 and similarly classified, within the subsets identified as relating to partial discharges; the correlation module is therefore configured to derive a pair of subsets of signals relating to pulses generated at the same discharge site 2.

According to the invention, the module for selecting the pair of signals relating to the pair of homologous pulses is configured to select from the signals said pair of correlated subsets.

The module for selecting the pair of homologous pulses comprises means 10 for synchronizing the signals detected in the first sensor 5 and those detected in the second sensor 7 (these synchronizing means consist, for example, of a GPS system or other per se known absolute reference systems).

Thus, the selection module is configured to select at least one pair of signals detected in the respective sensors (that is, a first signal from the pair of signals detected in the first sensor 5 and a second signal from the pair of signals detected in the second sensor 7) in a single time interval smaller than a predetermined value.

In effect, since the distance between the detecting stations 6, 8 is known, and since the propagating speed of the pulses 4 along the apparatus 3 can be estimated (even approximately), the transit time T, that is, the time that it would take for a pulse 4 to propagate along the apparatus 3 from the first detecting station 6 to the second detecting station 8, or vice versa, is also known (or at least can be estimated approximately).

Thus, the selection module, for a signal belonging to a subgroup (of signals detected in the first sensor 5) identified as relating to a partial discharge activity (originating at the discharge site 2) and detected at an instant $t_1$, checks whether among the signals of the subgroup correlated with it (that is, the subgroup of signals detected in the other sensor 7 and relating to a partial discharge activity classified in a similar manner) there is a signal detected at an instant $t_2$ falling within a predetermined time interval including $t_1$.

Preferably, a reference time interval whose centre is $t_1$ and whose duration is two times T is processed. Operatively, the reference time interval used has as its starting instant the instant $t_1-T$ and as its ending instant the instant $t_1+T$. If the correlated subgroup (that is, the subgroup of signals detected in the other sensor 7 and relating to a discharge activity classified in a similar manner) includes an instant $t_2$ included in said reference time interval, the signals detected at the instants $t_1$ and $t_2$ are selected as relating to a pair of homologous pulses 4.

It should be noted that, preferably the pulse detection instants are calculated from a reference instant consisting preferably of an instant when measurement starts.

Thus, the instants $t_1$ and $t_2$ mentioned above correspond to the intervals of time that elapse between the reference instant and the corresponding detection instant.

Preferably, the derivation module is configured to derive a first shape parameter correlated with the frequency content of the signal and a second shape parameter correlated with the duration of the signal.

Preferably, the separation module is configured to group into a single subset all the signals falling within the same region of a reference plane having as its coordinates said first and second shape parameters.

The separation module is thus designed to group the signals into subsets which are uniform in terms of the waveform of the pulses 4. Since the waveform of a pulse 4 is correlated with the transfer function the pulse 4 is subjected to as it travels from the source that generated it to the sensor, the signals grouped together in a single subset can be traced to the same source.

This makes it possible to separate the signals relating to a partial discharge activity from signals due to noise or to a different partial discharge activity (that is, taking place at a different discharge site).

It should be noted, however, that comparing the shape of the pulses acquired in the same sensor makes sense, whereas it would not be significant to compare the shape of the signals detected in different sensors.

The function of the identification module can be explained with this in mind.

The identification module is designed to assign the signals in each (separate) subgroup to a particular type of source, which means it allows the subgroups to be classified.

Preferably, the module for identifying a subset involves the use of a fuzzy inference motor operating according to the values of the phase and amplitude parameters for the signals in that subset.

Indeed, signals in the same subgroup and represented in a plane having as its coordinates the phase and amplitude parameters, are arranged according to a trace correlated with the nature of the source which generated the pulses relating to those signals.

For the purpose of identification, therefore, it is necessary to process (statistically) the signals of a subgroup.

Preferably, the identification module is configured to classify the subgroups according to the shape of the trace (defined by the signals of the subset being examined in the form of points in a reference plane having as its coordinates the phase and amplitude parameters).

It should be noted, however, that if a group of signals is identified without first separating the signals out into uniform groups, there is the risk of analysing a trace containing signals from different sources (due to noise, for example); this would nullify any form of statistical processing, making the resulting identification unreliable.

The device 1 therefore allows the signals relating to pairs of homologous pulses to be identified with a particularly good degree of reliability.

Advantageously, the device 1 does not require that the distance between the sensors and the propagation of the pulses in the apparatus 3 be known with particular precision.

Advantageously, even a particularly high degree of precision in processing the time phase shift, using the synchronization means 10, between the instants of detecting the signals in different sensors is unnecessary.

In effect the selection module (which checks that the pulses 4 of the selected have been detected in a time interval which is less than a predetermined value, for example a value T) operates on subsets of signals (received from the separation and identification modules) containing only signals corresponding to pulses 4 relating to partial discharges that occurred at the same source.

It should be noted that analysing the sign of the signals (that is, the fact that the sensors 5, 7 are directional sensors) makes it possible to guarantee that selected pairs of signals relate to pulses generated at a discharge site 2 interposed between, and not on the outside of, the sensors 5, 7.

According to another aspect of the invention, the derivation module is configured to derive (at least for the signals of the selected pair of homologous pulses) at least one attenuation parameter, correlated with a quantity that is variable depending on a distance travelled by the pulses from the discharge site 2 to the corresponding detecting station.

Preferably, the attenuation parameter is the amplitude parameter; this advantageously makes it possible to avoid further processing by the derivation module.

The attenuation parameter might, however, might also consist of other quantities such as, for example, a quantity linked to the frequency content of the signal.

According to the invention, the calculation module is configured to process the values of the attenuation parameter for the signals of the selected pair of homologous pulses. More specifically, the calculation parameter is configured to compare the detected attenuation parameter values of the sensors 5 and 7.

Described below is an example of an algorithm for calculating the distances $z_1$ and $z_2$ (of the detecting stations 6 and 8 from the discharge site 2) based on processing the attenuation parameter (which, in this example, is the amplitude of the signals).

Using as attenuation parameter the amplitude of the signals, two values $V_1$ and $V_2$ for the amplitude of the signals of the pair of homologous pulses are, for example, detected in the first sensor 5 and in the second sensor 7, respectively.

The values $z_1$ and $z_2$ of the desired distances can be calculated by solving equation (1) set out below.

$$V_1 = V_2 \cdot \exp(\alpha \cdot z_2 \alpha \cdot z_1) \qquad (1)$$

In equation (1), $\alpha$ is an attenuation constant.

The constant $\alpha$ can be derived (for example using suitable tables) according to the type of material used to make the electrical apparatus 3 (and, more specifically, the insulating material of the apparatus 3).

Equation (1) expresses the attenuation of the pulses 4 corresponding to the same partial discharge and propagated from the discharge site 2 where they originated to the detecting stations 6, 8 where they are detected.

It should be noted that the quantity $z_1+z_2$ is known since it is the distance between the sensors 5, 7 (that is, between the detecting stations 6, 8) along the cable.

This allows equation (1) to be solved for $z_1$ and $z_2$.

The value of the constant $\alpha$ depends also on the frequency of the signal.

In light of this, the calculation module is configured to derive, from the signals of the selected pair of homologous pulses, corresponding signals transformed by means of the Fourier transform and to process the attenuation parameter values on the transformed signals, for a plurality of frequency values.

In the example described above, the calculation module is implemented according to equation (2) below.

$$V_1(\omega) = V_2(\omega) \cdot \exp(\alpha(\omega) \cdot z_2 - \alpha(\omega) \cdot z_1) \qquad (2)$$

This advantageously allows a particularly accurate measurement to be made of the distances of the discharge site 2 from the detecting stations 6 and 8, thanks to the fact that processing is done in the frequency domain, thereby obtaining a plurality of values for these distances which are then averaged.

Averaging the values obtained for different transformed terms of the signals also has the advantage of being performed from the same selected pair of pulses.

The fact of processing signal attenuation in the frequency domain is particularly advantageous if the sensors 5, 7 used and the processing unit 9 form a broad detection band (as is preferably the case according to the invention).

In fact, according to the invention, the selection module is configured to select a plurality of pairs of signals relating to corresponding pairs of pulses 4 belonging to the same selected pair of signal subsets.

This advantageously allows calculation of a plurality of values $z_1$ and $z_2$ corresponding to the different pairs of signals to be further processed statistically (for example, to calculate an average value and a confidence interval).

Thus, the device 1 allows estimation of two orders of statistical averages of the values ($z_1$ and $z_2$) to be detected. That allows a good degree of locating reliability and accuracy to be achieved and also makes it possible to assign (in a particularly precise and reliable manner) a confidence value to these calculated values.

This invention also provides a method for locating partial discharges occurring at the discharge site 2 in the electric apparatus 3.

The method comprises the following steps:

detecting 11 the electric pulses 4 picked up by the first sensor 5 and second sensor 7, operatively connected to the apparatus 3 in the first detecting station 6 and second detecting station 8 (respectively) which are spaced out along the apparatus 3, and generating corresponding electric signals representative of the waveform of the pulses 4;

selecting 12 at least one pair of signals, detected in the first and the second sensor, representative of a pair of homologous pulses (that is to say, pulses relating to the same partial discharge and propagating in opposite directions along the apparatus 3), detected in the first sensor 5 and in the second sensor 7, respectively, in the same time interval which is less than a predetermined value;

calculating 13 the distance of the discharge site 2 from the detecting stations 6 and 8, based on the selected pair of signals.

According to the invention, the method further comprises the following, steps after the detection step 11:

assigning 14 to each signal detected a phase parameter value representative of the phase of the voltage applied to the electrical apparatus at the moment the signal is detected;

deriving 15, for each of the signals detected, at least one shape parameter correlated with the waveform of the pulse 4 corresponding to that signal;

deriving 16, for each of the signals, at least one amplitude parameter correlated with the amplitude of the signals;

separating 17 the sets of the signals detected in each detecting station into respective subsets, so that the signals of each subset have similar shape parameter values (preferably as described above in connection with the device 1);

identifying 18 the subsets of signals relating to partial discharges and classifying them according to statistical processes based on the values of the amplitude and phase parameters for the signals of each subset processed individually (preferably as described above in connection with the device 1);

correlating 19 the subsets of signals detected in the first detecting station 6 and in the second detecting station 8 and similarly classified, within the subsets identified as relating to partial discharges, in order to derive a pair of subsets of signals relating to pulses generated at the same discharge site 2.

In light of this, the step of selecting the pair of homologous pulses is applied to the signals belonging to said pair of correlated subsets.

That way, the locating method according to the invention is particularly reliable since it allows a particularly sure and consistent selection of the signals relating to the pairs of homologous pulses.

Further, the method is particularly robust since it does not require particular accuracy in processing the time phase shift between the pulse detection instants (this process being particularly critical and not very precise).

Preferably, before the selection step (and, more specifically, during the detection step) the invention contemplates a step of synchronizing the signals detected in the first sensor 5 and those detected in the second sensor 7, by means of an absolute time reference (as described above in connection with the device 1).

Preferably, the assignment step 14 comprises deriving, for each of the (digital) signals detected, a first shape parameter correlated with the frequency content of the signal and a second shape parameter correlated with the duration of the signal.

In light of this, the separation step 17 comprises incorporating in a single subset all the signals falling within the same region of a reference plane having as its coordinates said first and second shape parameters.

Preferably, the identification step 18 involves the use of a fuzzy inference motor operating according to the values of the phase and amplitude parameters for the signals in that subset.

Preferably, in the identification step 18, classification is performed according to the shape of the trace defined by the signals of that subset in the form of points in a reference plane having as its coordinates the phase and amplitude parameters.

It should be noted that the separation step 17 must precede the identification step 18. The step 15 of deriving the shape parameter must precede the separation step 17.

The steps 14 of assigning the phase parameter and 16 of deriving the amplitude parameter must precede the identification step 18.

On the contrary, the assignment step 14 and the derivation step 16 must follow the separation step 17. That has the advantage of preventing the phase parameter assignment step 14 and the amplitude parameter derivation step 16 from being applied to the signals of any subgroups that have been filtered out (and hence subsequently ignored) based on the shape parameter (for example because the shape parameter adopts values typical of noise).

According to another aspect of the invention, the method comprises a step of deriving, at least for the signals of the selected pair of homologous pulses, at least one attenuation parameter, correlated with a quantity that is variable depending on a distance travelled by the pulses 4 from the discharge site 2 to the corresponding detecting station.

Preferably, the attenuation parameter is the amplitude parameter.

In that case, if the step 16 of deriving the amplitude parameter is performed for all the signals detected, a further step of deriving the attenuation parameter is not necessary.

If the step 16 of deriving the amplitude parameter is not performed, on the other hand, a step of deriving the attenuation parameter is necessary. In that case, said step of deriving the attenuation parameter is performed after the selection step 12, so as to save time and resources.

In effect, derivation of the attenuation parameter is important only for the selected signals.

In effect, also according to the invention, calculating the distance between the discharge site 2 and the detecting stations 6 and 8 comprises processing (that is, comparing) the values of the attenuation parameter for the signals of the selected pair of homologous pulses.

In the example described above, the calculation step comprises using an algorithm based on equation (1).

Preferably, the (digital) signals of the selected pair of homologous pulses are processed in the frequency domain.

More specifically, from the (digital) signals of the selected pair of homologous pulses are derived corresponding signals transformed using the Fourier transform.

In light of this, the step 13 of calculating the distance of the discharge site 2 from the detecting stations is performed on the transformed signals for a plurality of frequency values (using equation (2), for example).

Thus, for the same selected pair of signals (relating to a corresponding pair of homologous pulses 4) the calculation step 13 is preferably repeated a predetermined number of times (for each of the frequency values).

In that case, the method comprises a step 20 of averaging (the term averaging being used generically to mean a statistical process for obtaining an average value from a plurality of values) the plurality of values of distance (between the discharge site 2 and the detecting stations 6 and 8) calculated by repeating the calculation step 13 for different frequency values.

The averaging step 20 requires that the plurality of values calculated be subjected to a statistical process.

Preferably, the plurality of frequency values which the calculation step 13 is repeated for fall within the range of approximately 1 MHz and approximately 100 MHz.

Preferably, the method comprises repeating the selection step 12 a predetermined number of times in order to select signals representative of a plurality of pairs of homologous pulses and calculate a corresponding plurality of values of the distance between the discharge site 2 and the detecting stations 6 and 8.

It should be noted that the step 12 of selecting signal pairs relating to different pairs homologous pulses is repeated in the context of the same pair of correlated subsets (containing data acquired in the same discharge activity).

In light of this, there is a further step 21 of averaging the calculated distance values for the different selected pairs of signals; said averaging step comprises statistical processing of said values.

Preferably, each of the distance values detected for the different selected pairs (subjected to said further averaging step 21) is in turn the result of the step 20 of averaging the plurality of distance values calculated for corresponding pluralities of frequency values (as described above).

That advantageously translates as robustness and particularly high accuracy in locating (meaning by this calculation of the values of distance of the discharge site 2 from the detecting stations, and preferably also identifying a confidence interval on these values).

Calculating the distances $z_1$ and $z_2$ of the discharge site 2 from the detecting stations 6, 8 thus allows location 22 of the discharge site 2 itself.

This invention therefore offers the following advantages.

The device 1 and method for locating the discharge site 2 in the apparatus 3 are particularly reliable because they allow signals relating to pairs of homologous pulses to be selected in a particularly reliable and sure manner.

In effect, selection is performed only among signals relating only to pulses corresponding to the target discharge activity; hence, the risk of comparing non-uniform signals is avoided; that is to say, the risk of error in selecting the pairs of homologous pulses is drastically reduced.

Moreover, selecting the signals relating to the pairs of homologous pulses as proposed by the invention is particularly robust compared to the uncertainty in determining the time phase shift between the instants of detecting the pairs of pulses, thereby also simplifying the synchronization means.

Another advantage of this invention is that of suggesting a particularly efficient system for calculating the distances of the discharge site 2 from the detecting stations, based on processing (and, more specifically, comparing) the attenuation of the selected signals.

That way, location is particularly accurate and robust because it avoids possible errors and imprecision in determining the time phase shift between the signals.

Furthermore, the invention advantageously allows statistical processing to be performed on a plurality of calculated values and, if necessary, even a second statistical process in cascade, making the calculation particularly accurate and allowing a particularly robust identification of a confidence interval on the calculated value.

The invention claimed is:

1. A method for locating partial discharges occurring at a discharge site (2) in an electric apparatus (3) with elongate geometry and generating corresponding electric pulses (4) propagating in opposite directions along the apparatus (3) from the discharge site (2), the method comprising the following steps:

detecting (11) the electric pulses (4) picked up by a first and a second sensor (5, 7), operatively connected to the apparatus (3) in a first and a second detecting station (6, 8) which are spaced out along the apparatus (3), and generating corresponding electric signals representative of the waveform of the pulses (4);

selecting (12) at least one pair of signals, detected in the first and the second sensor (5, 7), representative of a pair of homologous pulses (4), relating to the same partial discharge and propagating in opposite directions along the apparatus;

deriving, for the signals of the selected pair of homologous pulses (4), at least one attenuation parameter, correlated with a quantity that is variable depending on a distance travelled by the pulses (4) from the discharge site (2) to the corresponding detecting station, said attenuation parameter including amplitude of the signal;

calculating (13) the distance, along the apparatus (3), between the discharge site (2) and the detecting stations (6, 8), based on processing the values of the attenuation parameter for the signals of the selected pair of homologous pulses (4), wherein said processing comprises the calculation of an algorithm which links the attenuation parameter value of one of the signals of the pair of homologous pulses to the attenuation parameter value of the other one of the signals of the pair of homologous pulses, as a function of the difference between the distances of the first and a second detecting station (6, 8) with respect to the discharge site (2), whereby said algorithm expresses the attenuation of the pulses (4) due to their propagation through the electric apparatus (3) from the discharge site (2) to the detecting stations (6, 8), wherein the amplitude attenuation of one of the signals of said pair of homologous pulses previously selected is compared to the amplitude attenuation of the other one of the signals of the same pair of homologous pulses, for calculating the distances of the discharge site (2) from the detecting stations.

2. The method according to claim 1, wherein from the signals of the selected pair of homologous pulses (4) corresponding signals transformed using the Fourier transform are derived, the calculation of the distance between the discharge site (2) and the detecting stations (6, 8) being carried out on the transformed signals for a plurality of frequency values, the corresponding plurality of distance values calculated then being subjected to statistical processing.

3. The method according to claim 2, wherein processing of the attenuation parameter for the transformed signals is performed within the range of frequencies between around 1 MHz and around 100 MHz.

4. The method according to claim 1, wherein the selection step (12), derivation step and calculation step (13) are repeated a predetermined number of times, for selecting signals representative of a plurality of pairs of homologous pulses (4) and calculating a corresponding plurality of values of the distance between the discharge site (2) and the detecting stations (6, 8), and comprising a step of statistically processing the values calculated.

5. The method according to claim 1, wherein, for the signals of the selected pair of homologous pulses (4), the amplitude of the signal detected by the corresponding sensor is derived, said amplitude constituting the at least one attenuation parameter.

6. The method according to claim 1, comprising, before the selection step (12), a step of synchronizing the signals detected in the first sensor (5) and those detected in the second sensor (7), the selection of the at least one pair of signals relating to homologous pulses (4) involving a check to see whether the selected signals were detected in the respective sensors (5, 7) in the same time interval which is less than a predetermined value.

7. The method according to claim 1, comprising, before the selection step (12), the following steps:

assigning (14) to each signal detected a phase parameter value representative of the phase of the voltage applied to the apparatus (3) at the moment the signal is detected;

deriving (15), for each of the signals, at least one shape parameter correlated with the waveform of the corresponding pulse (4);

deriving (16), for each of the signals, at least one amplitude parameter correlated with the amplitude of the corresponding pulse (4);

separating (17) sets of signals detected in each of the detecting stations into respective subsets, so that the signals of each subset have similar shape parameter values;

identifying (18) the subsets of signals relating to partial discharges and classifying them according to statistical processes based on the values of the amplitude and phase parameters for the signals of each subset considered individually;

correlating (19) the subsets of signals detected in the first and second detecting stations (6, 8) and similarly classified, within the subsets identified as relating to partial discharges, in order to derive a pair of subsets of signals relating to pulses (4) generated at the same discharge site (2), the step (12) of selecting said at least one pair of signals relating to homologous pulses (4) being applied to the signals belonging to the pair of correlated subsets.

8. A device (1) for locating partial discharges occurring at a discharge site (2) in an electric apparatus (3) with elongate geometry and generating corresponding electric pulses (4) propagating in opposite directions along the apparatus (3) from the discharge site (2), the device comprising:

a first and a second sensor (5, 7), operatively connected to the apparatus (3) in a first and a second detecting station (6, 8) which are spaced out along the apparatus (3), for detecting the pulses (4) and generating electric signals representative of the waveform of the pulses (4);

a processing unit (9) connected to the sensors (5, 7) for receiving the signals and having a module for selecting at least one pair of signals, detected in the first and second sensors (5, 7) and representative of a pair of homologous pulses (4), relating to the same partial discharge and propagating in opposite directions along the apparatus (3), and a module for calculating the distance between the discharge site (2) and the detecting stations (6, 8) along the apparatus (3) based on the selected pair of homologous pulses (4), wherein the processing unit (9) comprises a module for deriving, for the signals of the selected pair of homologous pulses (4), at least one attenuation parameter, correlated with an amplitude of the signal or another quantity which is variable depending on a distance travelled by the pulses (4) from the discharge site (2) to the corresponding detecting station, the calculation module being configured to process the attenuation parameter values for the signals of the selected pair of homologous pulses (4), wherein the processing unit (9) is programmed with an algorithm which links the attenuation parameter value of one of the signals of the pair of homologous pulses to the attenuation parameter value of the other one of the signals of the pair of homologous pulses, as a function of the difference between the distances of the first and a second detecting station (6, 8) with respect to the discharge site (2), whereby said algorithm expresses the attenuation of the pulses (4) due to their propagation through the electric apparatus (3) from the discharge site (2) to the detecting stations (6, 8), wherein the amplitude attenuation of one of the signals of said pair of homologous pulses previously selected is compared to the amplitude attenuation of the other one of the signals of the same pair of homologous pulses, for calculating the distances of the discharge site (2) from the detecting stations.

9. The device according to claim 8, wherein the module for selecting the pair of homologous pulses (4) comprises means (10) for synchronizing the signals detected in the first sensor (5) and those detected in the second sensor (7), the selecting module being configured to select at least one pair of signals detected in the respective sensors in the same time interval which is less than a predetermined value.

10. The device according to claim 8, wherein the calculation module is configured to derive, from the signals of the selected pair of homologous pulses (4), corresponding signals transformed by means of the Fourier transform and to process the attenuation parameter values on the transformed signals, for a plurality of frequency values.

\* \* \* \* \*